(12) United States Patent
Yasutake

(10) Patent No.: US 7,244,988 B2
(45) Date of Patent: Jul. 17, 2007

(54) SEMICONDUCTOR APPARATUS AND METHOD OF MANUFACTURING THE SAME

(75) Inventor: Nobuaki Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 11/044,630

(22) Filed: Jan. 28, 2005

(65) Prior Publication Data

US 2005/0170597 A1 Aug. 4, 2005

(30) Foreign Application Priority Data

Jan. 30, 2004 (JP) ............................. 2004-022912

(51) Int. Cl.
*H01L 29/76* (2006.01)

(52) U.S. Cl. ................ 257/331; 257/336; 257/377

(58) Field of Classification Search ................ 257/288, 257/377, 331–332, 410, 336; 438/574, 579
See application file for complete search history.

(56) References Cited

U.S. PATENT DOCUMENTS 5,949,105 A * 9/1999 Moslehi ..................... 257/336

6,800,536 B2 * 10/2004 Kurata ....................... 438/387

FOREIGN PATENT DOCUMENTS

JP 2002-231942 A 8/2002

* cited by examiner

*Primary Examiner*—Theresa T. Doan
(74) *Attorney, Agent, or Firm*—Foley & Lardner LLP

(57) ABSTRACT

A semiconductor apparatus is disclosed. The semiconductor apparatus comprises a gate electrode formed on a surface of a semiconductor substrate with a gate insulating film provided therebetween. The semiconductor apparatus further comprises a gate sidewall insulating film having a three-layered structure formed of a first nitride film, an oxide film, and a second nitride film, which are formed on a sidewall of an upper portion of the gate electrode, and a gate sidewall insulating film having a two-layered structure formed of the oxide film and the second nitride film, which are formed on a sidewall of a lower portion of the gate electrode. The semiconductor apparatus further comprises a raised source/drain region formed of an impurity region formed in a surface layer of the semiconductor substrate and an impurity region grown on the impurity region.

15 Claims, 7 Drawing Sheets

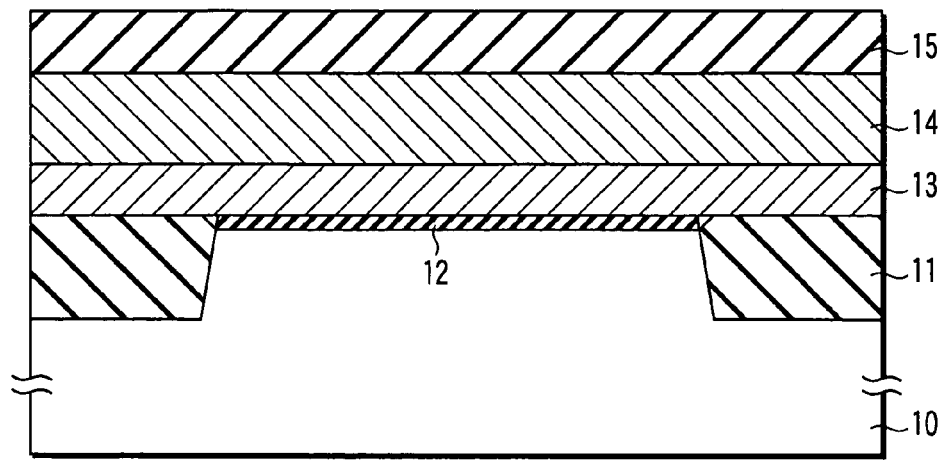
F I G. 1
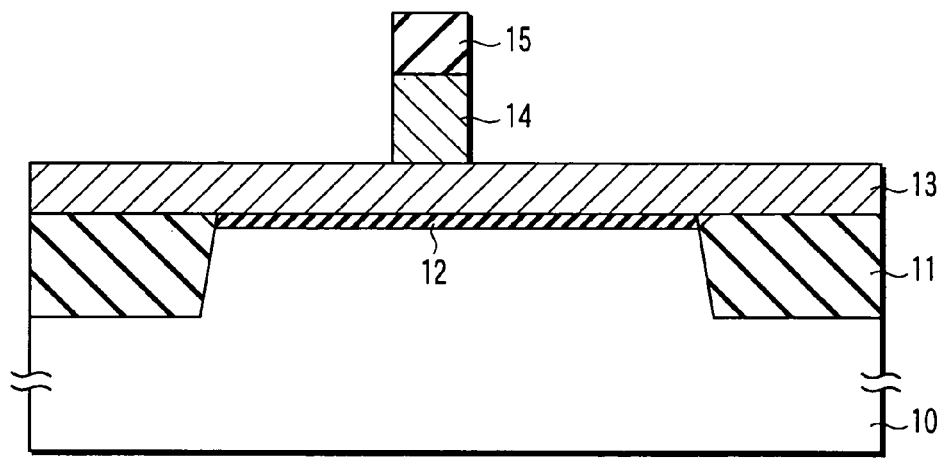
F I G. 2
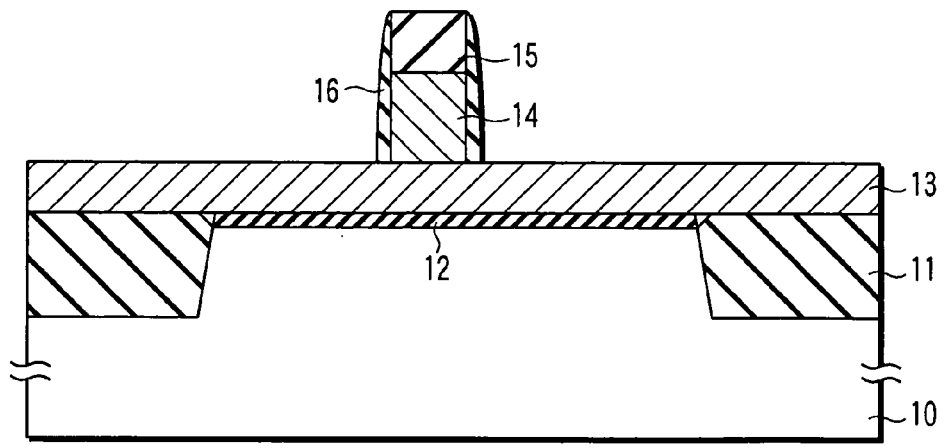
F I G. 3

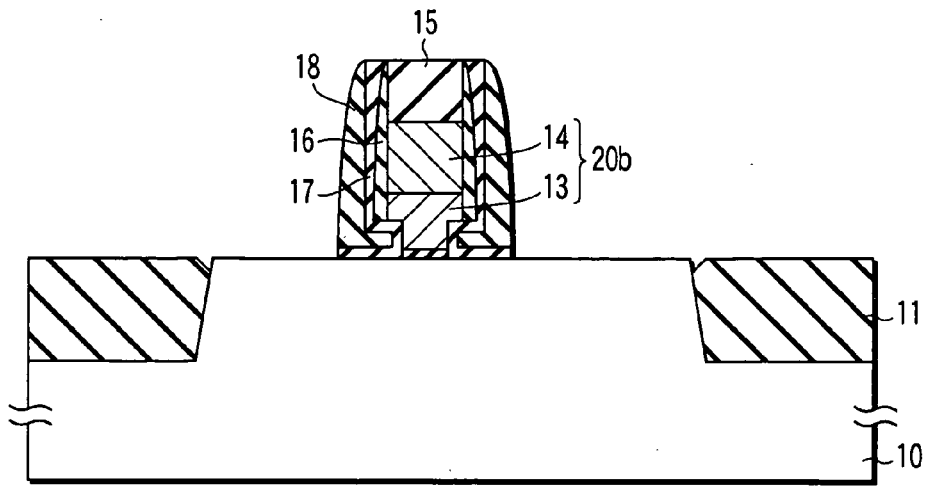
F I G. 12
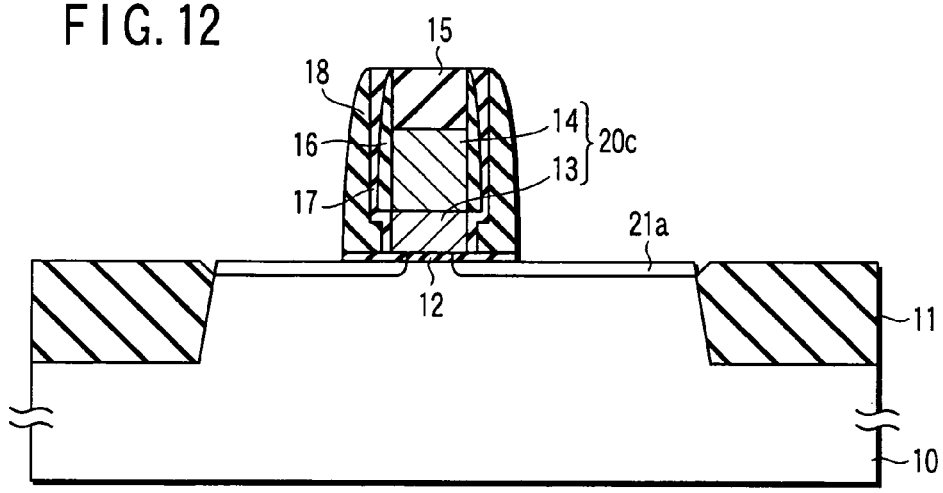
F I G. 13
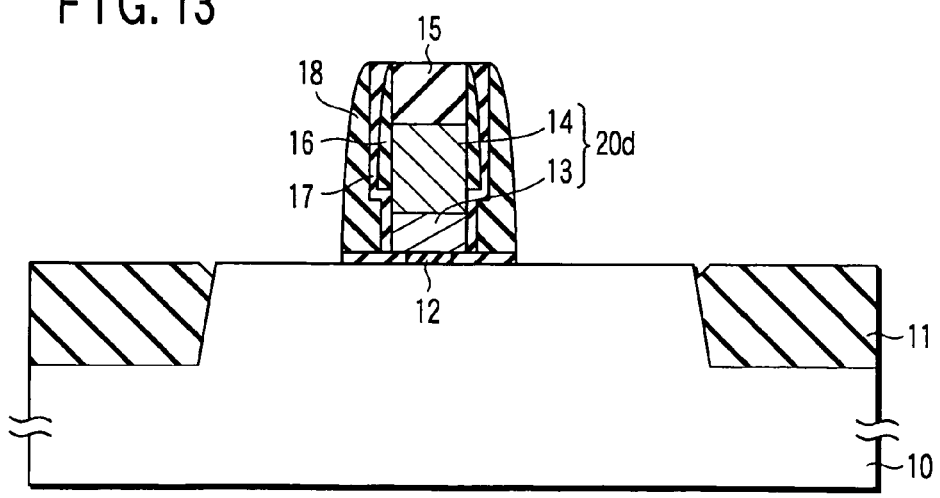
F I G. 14

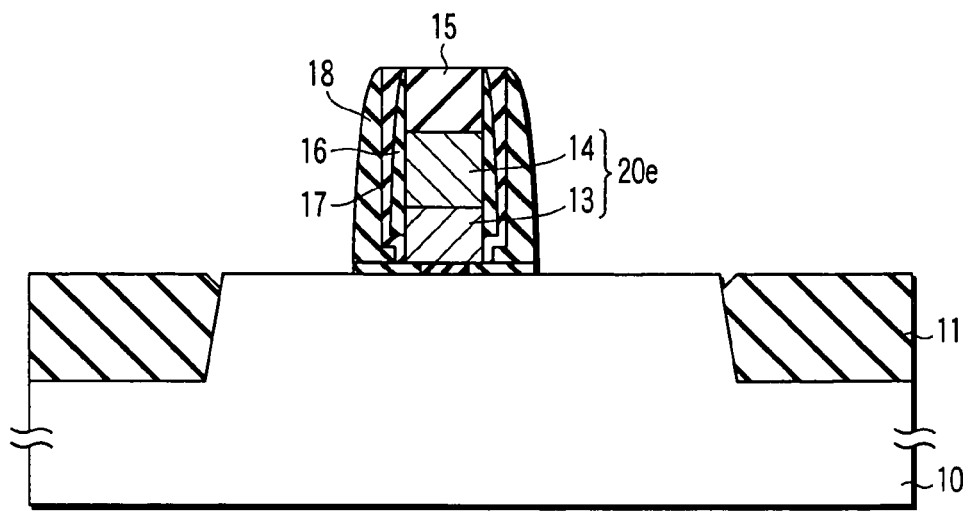
F I G. 15
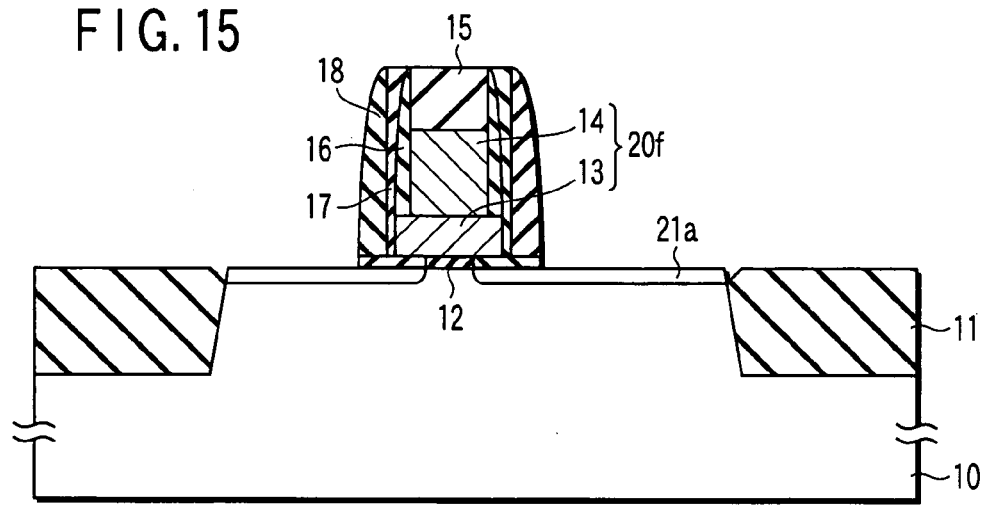
F I G. 16
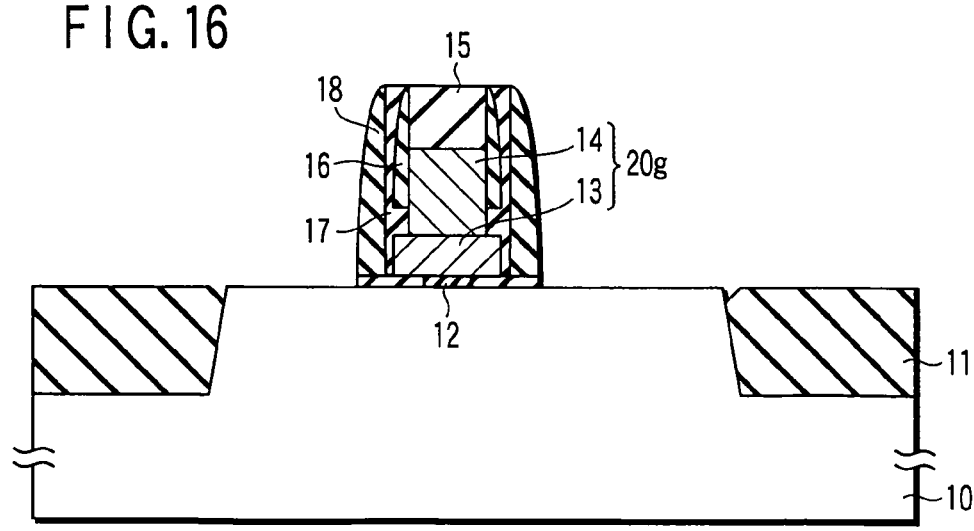
F I G. 17

SEMICONDUCTOR APPARATUS AND METHOD OF MANUFACTURING THE SAME

CROSS-REFERENCE TO RELATED APPLICATIONS

This application is based upon and claims the benefit of priority from prior Japanese Patent Application No. 2004-022912, filed Jan. 30, 2004, the entire contents of which are incorporated herein by reference.

BACKGROUND OF THE INVENTION

1. Field of the Invention

The present invention relates to a semiconductor apparatus and a method of manufacturing the same, and in particular, to a structure of a MISFET (Metal Insulator Semiconductor Field Effect Transistor) having a raised source/drain (raised S/D) structure.

2. Description of the Related Art

With respect to semiconductor integrated circuits, the design rule has been reduced in accordance with the high-density-packing of the semiconductor elements. With respect to a MIS type semiconductor integrated circuit, in order to suppress a short channel effect accompanying a reduction in a gate length, it is required that a depth of a diffusion layer is made shallow. At the same time, it is necessary to prevent increase of a resistance of the diffusion layer due to the depth of the diffusion layer being made shallow. In order to maintain the depth of the diffusion layer shallow and the resistance of the diffusion layer low, it is effective to combine a raised source/drain structure and a salicide structure.

FIGS. 19 and 20 respectively show cross sections of a semiconductor structure in a process in which a fine polysilicon gate electrode of a conventional MOSFET (Metal Oxide Semiconductor Field Effect Transistor) having a raised source/drain structure is processed.

In a method of manufacturing the semiconductor device, first, a gate oxide film 131 is formed on a silicon substrate 130, polysilicon is deposited on the gate oxide film 131, and a mask pattern 133 is formed on the polysilicon film. Then, an etching process is carried out to pattern the polysilicon film to form a polysilicon gate electrode 134 having a fine gate length, using the mask pattern 133 as an etching mask. Next, a sidewall of the polysilicon gate electrode 134 is covered with an oxide film, for example, a TEOS film 135. Then, an ion implantation is carried out to form a shallow diffusion layer 136 of an LDD (Lightly Doped Drain) type source/drain region in a surface layer of the silicon substrate 130. Thereafter, an SiN film is deposited on the silicon substrate 130, and next, the SiN film is subjected to an anisotropic etching process to form a gate sidewall insulating film 137. Next, an ion implantation is carried out to form a deep diffusion layer 138 of the LDD type source/drain region in the surface layer of the silicon substrate 130. The hard mask 133 deteriorates at the time of the anisotropic etching process for the SiN film, and a shoulder portion of the gate electrode 134 tends to crumble or to be deleted (shoulder deletion). Moreover, when an etching process is carried out to remove a lower portion of the gate sidewall insulating film 137 by using a hydrofluoric acid film (DHF), the oxide film 135 on the gate electrode side surface is retreated.

Thereafter, a silicon layer 130a is formed on the source/drain region by epitaxial growth to form a raised source/drain structure, as shown in FIG. 20. At this time, however, growth of a polysilicon 134a is brought about from the shoulder portion of the gate electrode 134 to the deleted portion of the mask 133, and a short circuit may be brought about between the gate electrode 134 and the raised source/drain region by the polysilicon 134a.

As described above, in the conventional MOSFET having a raised source/drain structure, there is a disadvantage that a short circuit may be brought about between the gate electrode and the source/drain region, as the gate electrode is made finer.

Jpn. Pat. Appln. KOKAI Publication No. 2002-231942 discloses a structure of a MIS type semiconductor apparatus having an elevated (raised) source/drain structure, in which a multi-sidewall-layered structure is formed on a sidewall of a gate electrode, and at least a part of an elevated source/drain region is formed between the semiconductor substrate and the sidewall layer.

BRIEF SUMMARY OF THE INVENTION

According to an aspect of the present invention, there is provided a semiconductor apparatus comprising:

a gate electrode formed on a surface of a semiconductor substrate with a gate insulating film provided therebetween;

a gate sidewall insulating film having a three-layered structure formed of a first nitride film, an oxide film, and a second nitride film, which are formed on a sidewall of an upper portion of the gate electrode, and a gate sidewall insulating film having a two-layered structure formed of the oxide film and the second nitride film, which are formed on a sidewall of a lower portion of the gate electrode; and a raised source/drain region formed of an impurity region formed in a surface layer of the semiconductor substrate and an impurity region grown on the impurity region.

According to another aspect of the present invention, there is provided a method for manufacturing a semiconductor apparatus comprising:

sequentially depositing a polysilicon germanium layer, a polysilicon layer, and a first oxide film on a gate oxide film formed on a surface layer of a silicon substrate;

patterning the first oxide film, and by using a pattern of the first oxide film as a mask, etching at least a portion of the polysilicon layer of the polysilicon layer/polysilicon germanium layer by anisotropic etching;

forming a first nitride film over the surface layer of the silicon substrate, and etching the first nitride film by anisotropic etching to form a first gate sidewall film of nitride on a sidewall of the first oxide film and the at least a portion of the polysilicon layer;

carrying out selective etching by using the pattern of the first oxide film and the first gate sidewall as masks, to etch at least a portion of the polysilicon germanium layer of the polysilicon layer/polysilicon germanium layer to form a gate electrode;

forming a shallow diffusion layer of a source/drain region in the surface layer of the silicon substrate;

sequentially depositing a second oxide film and a second nitride film over the surface layer of the silicon substrate, and patterning the second oxide film and the second nitride film by using a lithography technology and anisotropic etching, to form a three-layered gate sidewall insulating film formed of the first gate sidewall, the second nitride film, and the second oxide film, on an upper portion of the sidewall of the gate electrode, and a two-layered gate sidewall insulating film formed of the second nitride film and the second oxide film, on a lower portion of the sidewall of the gate electrode;

forming a silicon layer on the source/drain region by a selective epitaxial growth to form a raised source/drain region;

forming a deep diffusion layer of the source/drain region on the surface layer of the silicon substrate by an ion implantation;

removing the first oxide film on the gate electrode, and forming a silicide layer on the gate electrode and the source/drain region; and forming a wiring contacting the source/drain region.

BRIEF DESCRIPTION OF THE SEVERAL VIEWS OF THE DRAWING

FIG. 1 is a sectional view of a semiconductor structure in a manufacturing process for explanation of a method of manufacturing a MOSFET having a raised source/drain structure according to a first embodiment of the present invention.

FIG. 2 is a sectional view of a semiconductor structure in a manufacturing process following the process shown in FIG. 1 for explanation of the method of manufacturing a MOSFET having a raised source/drain structure according to the first embodiment of the present invention.

FIG. 3 is a sectional view of a semiconductor structure in a manufacturing process following the process shown in FIG. 2 for explanation of the method of manufacturing a MOSFET having a raised source/drain structure according to the first embodiment of the present invention.

FIG. 12 is a sectional view of a semiconductor structure in a manufacturing process following the process shown in FIG. 11 for explanation of the method of manufacturing a MOSFET having a raised source/drain structure according to the third embodiment of the present invention.

FIG. 13 is a sectional view of a semiconductor structure in a manufacturing process for explanation of a method of manufacturing a MOSFET having a raised source/drain structure according to a fourth embodiment of the present invention.

FIG. 14 is a sectional view of a semiconductor structure in a manufacturing process for explanation of a method of manufacturing a MOSFET having a raised source/drain structure according to a fifth embodiment of the present invention.

FIG. 15 is a sectional view of a semiconductor structure in a manufacturing process for explanation of a method of manufacturing a MOSFET having a raised source/drain structure according to a sixth embodiment of the present invention.

FIG. 16 is a sectional view of a semiconductor structure in a manufacturing process for explanation of a method of manufacturing a MOSFET having a raised source/drain structure according to a seventh embodiment of the present invention.

FIG. 17 is a sectional view of a semiconductor structure in a manufacturing process for explanation of a method of manufacturing a MOSFET having a raised source/drain structure according to an eighth embodiment of the present invention.

DETAILED DESCRIPTION OF THE INVENTION

First Embodiment

Figure 4:
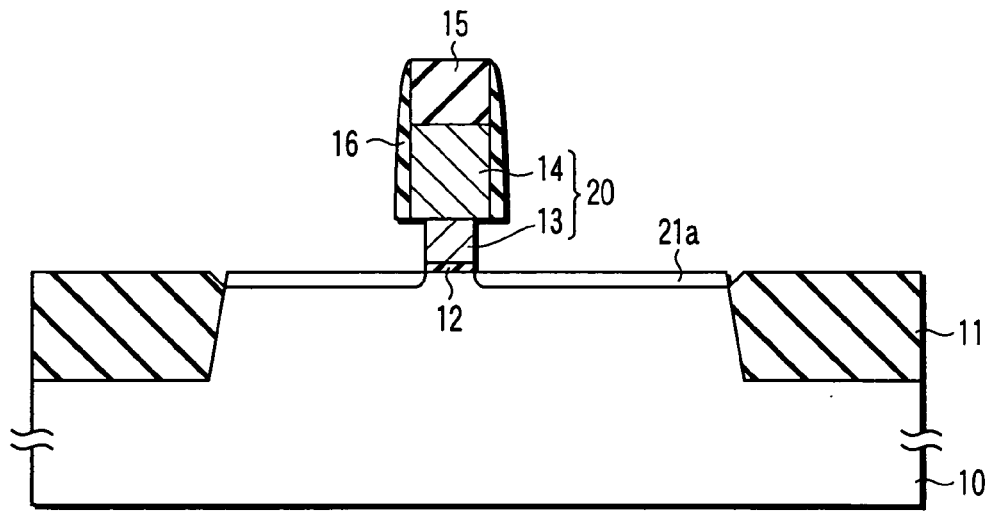
FIG. 4 is a sectional view of a semiconductor structure in a manufacturing process following the process shown in FIG. 3 for explanation of the method of manufacturing a MOSFET having a raised source/drain structure according to the first embodiment of the present invention.

FIG. 1 to FIG. 8 are sectional views of a semiconductor structure in respective manufacturing processes for explanation of a method of manufacturing a MOSFET having a raised source/drain structure according to a first embodiment of the present invention.

First, as shown in FIG. 1, a shallow trench isolation (STI) region 11 is formed in a surface layer of a silicon (Si) substrate 10, and a gate oxide film 12 is then formed on the surface of the silicon substrate 10. Then, a polysilicon germanium (poly-SiGe) layer 13, a polysilicon (poly-Si) layer 14, and a first oxide film ($SiO_2$ film) 15 are sequentially formed over the surface of the silicon substrate 10.

Next, as shown in FIG. 2, a patterning is carried out for the first oxide film 15 by using lithography technology and anisotropic etching. Subsequently, the polysilicon layer 14, of the superposed layer structure of the polysilicon layer 14 and the polysilicon germanium layer 13, is etched by anisotropic etching, by using the first oxide film 15 onto which the patterning has been carried out as a mask. Polysilicon and polysilicon germanium can be selectively etched.

Next, a first nitride film (SiN film) is formed to be about 10 nm over the surface of the silicon substrate 10, and then an anisotropic etching is carried out for the first nitride to form a first gate sidewall insulating film 16 of the nitride film on the sidewalls of the polysilicon layer 14 and the first oxide film 15, as shown in FIG. 3. Subsequently, the polysilicon germanium layer 13 is selectively etched, by using the first oxide film 15 and the first gate sidewall insulating film 16 as masks to form a gate electrode 20 formed of the polysilicon layer 14 and the polysilicon germanium layer 13, as shown in FIG. 4. In this etching of the polysilicon germanium layer 13, the polysilicon layer 14 is not etched. Also, in the etching of the polysilicon germanium layer 13, a bottom portion of the polysilicon layer 14 is exposed. However, since this etching has selectivity for polysilicon and polysilicon germanium, the polysilicon layer 14 is not etched in this etching. In this etching, the polysilicon germanium layer 13 is etched to be smaller in width than the polysilicon layer 14. Namely, the width of the lower portion of the gate electrode 20 (i.e., the polysilicon germanium layer 13) is smaller than the width of the upper portion of the gate electrode 20 (i.e., the polysilicon layer 14), and therefore, the side surface of the lower portion of the gate electrode 20 is retreated from the side surface of the upper portion of the gate electrode 20. Then, an ion implantation is carried out to form a shallow diffusion layer (i.e., an extension region) 21a of an LDD (Lightly Doped Drain) type source/drain region in the surface layer of the silicon substrate 10.

Figure 5:
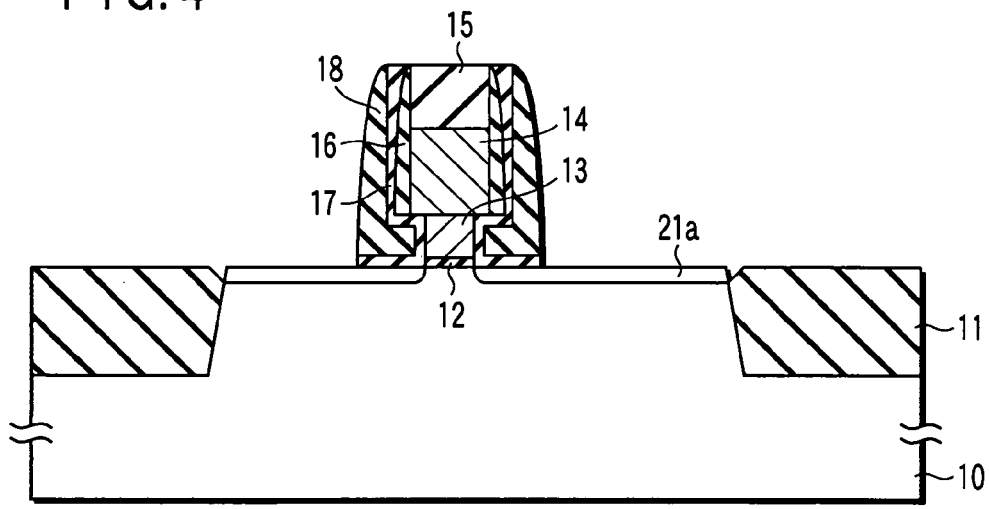
FIG. 5 is a sectional view of a semiconductor structure in a manufacturing process following the process shown in FIG. 4 for explanation of the method of manufacturing a MOSFET having a raised source/drain structure according to the first embodiment of the present invention.

Next, as shown in FIG. 5, a second oxide film (for example, a TEOS oxide film) 17 and a second nitride film 18 are sequentially deposited over the surface of the semiconductor substrate 10. Thereafter, a patterning is carried out for the second nitride film 18 and the second oxide film 17, by using lithography technology and anisotropic etching, to form a second gate sidewall insulating film from the second nitride film 18 and the second oxide film 17 onto which the patterning has been carried out. Accordingly, a three-layered sidewall insulating film (i.e., the first nitride film 16, the second oxide film 17, and the second nitride film 18) is provided on the side surface of the upper portion of the gate electrode 20 (i.e., the polysilicon layer 14), and a two-layered sidewall insulating film (i.e., the second oxide film 17 and the second nitride film 18) is provided on the side surface of the lower portion of the gate electrode 20 (i.e., the polysilicon germanium layer 13).

Figure 6:
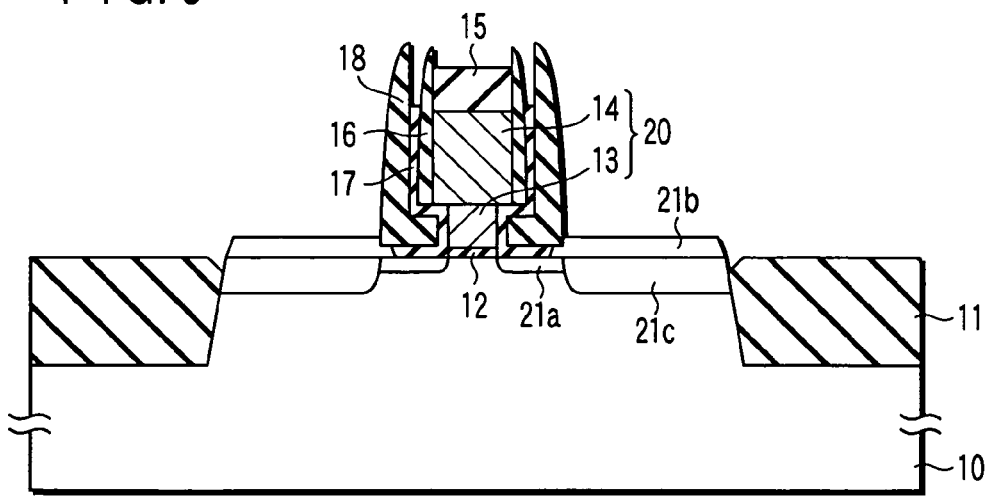
FIG. 6 is a sectional view of a semiconductor structure in a manufacturing process following the process shown in FIG. 5 for explanation of the method of manufacturing a MOSFET having a raised source/drain structure according to the first embodiment of the present invention.

Next, as shown in FIG. 6, a silicon portion 21b is formed on a region for formation of the source/drain by epitaxial growth. At this time, no-growth of polysilicon from the shoulder portion of the gate electrode 20 is brought about, since the upper portion of the gate electrode 20 is covered with the first nitride film serving as the first gate sidewall insulating film 16, and the shoulder portion of the gate electrode 20 is not exposed. Then, an ion implantation is carried out to form a deep diffusion layer 21c of the LDD type source/drain region in the surface layer of the silicon substrate 10. Thus, a raised source/drain region is formed.

Figure 7:
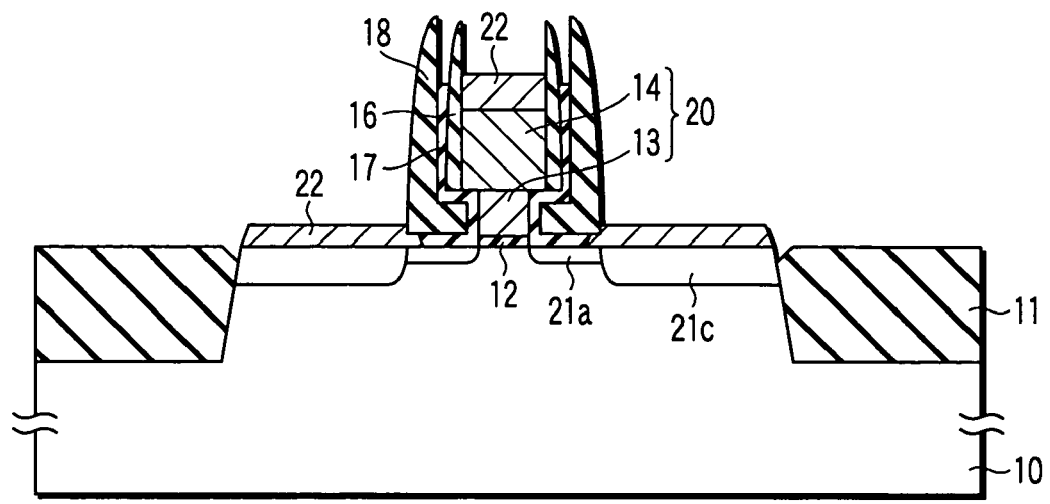
FIG. 7 is a sectional view of a semiconductor structure in a manufacturing process following the process shown in FIG. 6 for explanation of the method of manufacturing a MOSFET having a raised source/drain structure according to the first embodiment of the present invention.

Next, the first oxide film 15 on the gate electrode 20 is removed by wet etching, and then, as shown in FIG. 7, a silicide layer (for example, an NiSi layer) 22 is formed on the gate electrode 20 and the source/drain region.

Thereafter, usual processes are carried out, that is, a third nitride film 23 is formed, an interlayer insulating film 24 is formed, and a contact hole is formed. Furthermore, a metal wiring plug 25 and a metal wiring 26 in contact with the source/drain region are formed.

In accordance with the MOSFET having a raised source/drain structure in the present embodiment, the following advantages are obtained.

Polysilicon-growth from the shoulder portion of the gate electrode 20 can be prevented at the time of forming the raised source/drain region, since the shoulder portion of the gate electrode 20 is prevented from being exposed, by the sidewall 16 formed of the first nitride film at the upper portion of the gate electrode 20.

Since the gate electrode 20 is formed in a two-layered structure of the polysilicon layer 14 and the polysilicon germanium layer 13, which can be selectively etched, and the polysilicon germanium layer 13 is formed to be thinner by selective etching, the sidewall of the lower portion of the gate electrode 20 is retreated from the sidewall of the upper portion of the gate electrode 20. Accordingly, the size, i.e., width, of the gate structure is reduced by at least the width of the sidewall nitride film 16. Furthermore, a gate electrode length lower than that defined by the limit size of lithography can be realized.

Since the sidewall of the lower portion of the gate electrode 20 is retreated from the sidewall of the upper portion of the gate electrode 20, an offset is provided to the ion implantation for forming the source/drain extension region. Thus, the short channel effect can be reduced.

Second Embodiment

Figure 9:
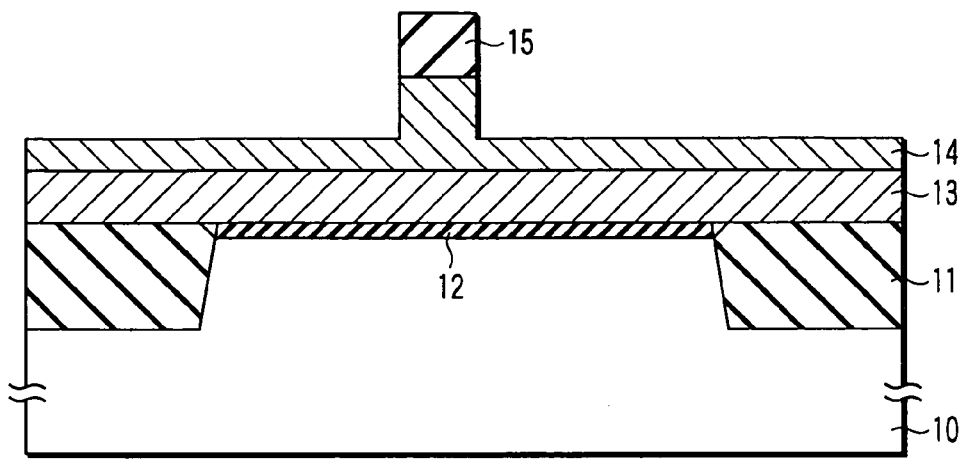
FIG. 9 is a sectional view of a semiconductor structure in a manufacturing process for explanation of a method of manufacturing a MOSFET having a raised source/drain structure according to a second embodiment of the present invention.
Figure 10:
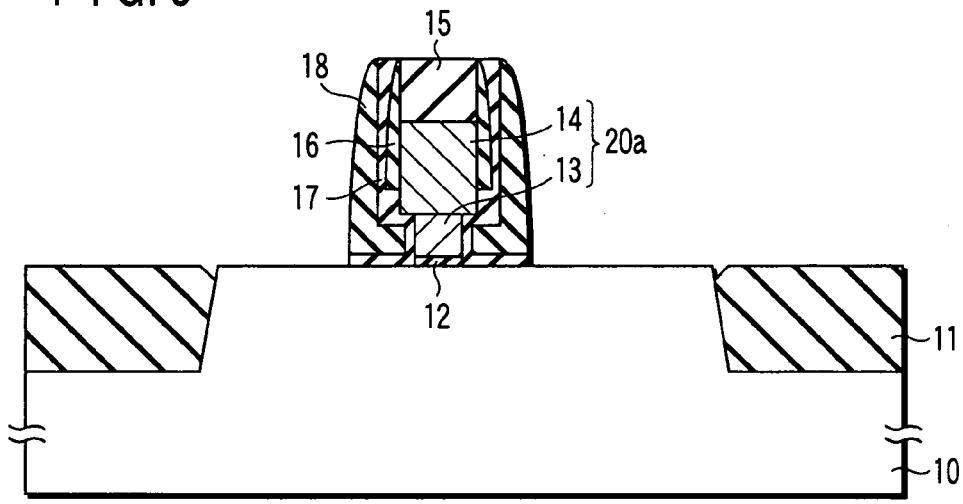
FIG. 10 is a sectional view of a semiconductor structure in a manufacturing process following the process shown in FIG. 9 for explanation of the method of manufacturing a MOSFET having a raised source/drain structure according to the second embodiment of the present invention.

FIG. 9 and FIG. 10 are sectional views of a semiconductor structure in respective manufacturing processes for explanation of a method of manufacturing a MOSFET having a raised source/drain structure according to a second embodiment of the present invention.

In the same manner as in the first embodiment, a first oxide film (e.g., SiO$_2$ film) is formed over the surface of the silicon substrate 10 on which the polysilicon germanium layer 13 and the polysilicon layer 14 are formed, and next, a patterning is carried out for the oxide film by using lithography technology and anisotropic etching to provide the first oxide film (e.g., SiO$_2$ film) 15, as shown in FIG. 9.

Subsequently, the polysilicon layer 14, of the superposed layer structure of the polysilicon layer 14 and the polysilicon germanium layer 13, is etched to some depth by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewall of the first oxide film 15 and the sidewall of the exposed portion of the polysilicon layer 14 (i.e., the upper portion of the polysilicon layer 14), as shown in FIG. 10. Subsequently, the other portion of the polysilicon layer 14 (i.e., the lower portion of the polysilicon layer 14) and the polysilicon germanium layer 13 are selectively etched, by using the first oxide film 15 and the first gate sidewall insulating film 16 as masks, to form a gate electrode 20a formed of the polysilicon layer 14 and the polysilicon germanium layer 13, as shown in FIG. 10. At this time, the polysilicon layer 14 and the polysilicon germanium layer 13 are etched with selectivity between the layers 13 and 14. This etching is carried out so that the polysilicon germanium layer 13 is etched to be smaller in width than the polysilicon layer 14. Namely, the width of the lower portion of the gate electrode 20a (i.e., the polysilicon germanium layer 13) is smaller than the width of the upper portion of the gate electrode 20 (i.e., the polysilicon layer 14), and therefore, the sidewall of the lower portion of the gate electrode 20 is retreated from the sidewall of the upper portion of the gate electrode 20.

The following processes are the same as those in the first embodiment. That is, after that, an ion implantation is carried out to form a shallow diffusion layer (i.e., an extension region) 21a of an LDD (Lightly Doped Drain) type source/drain region in the surface layer of the silicon substrate 10.

Figure 8:
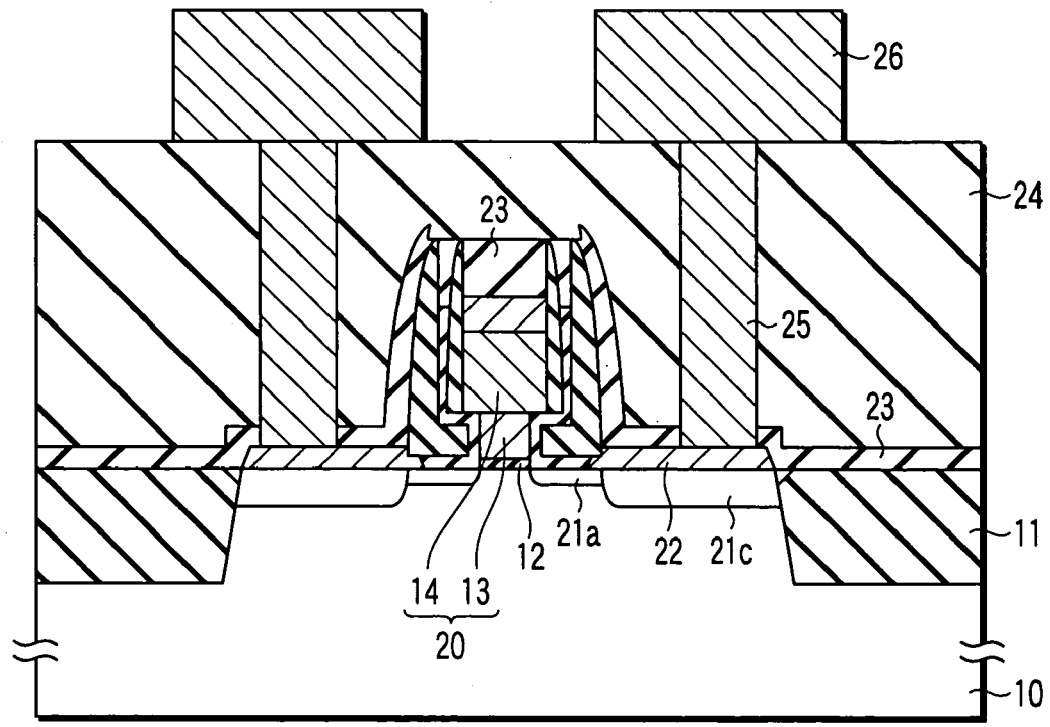
FIG. 8 is a sectional view of a semiconductor structure in a manufacturing process following the process shown in FIG. 7 for explanation of the method of manufacturing a MOSFET having a raised source/drain structure according to the first embodiment of the present invention.

Next, a second oxide film (for example, a TEOS oxide film) 17 and a second nitride film 18 are sequentially deposited over the surface of the semiconductor substrate 10. Thereafter, a patterning is carried out for the second nitride film 18 and the second oxide film 17, by using lithography technology and anisotropic etching, to form a second gate sidewall insulating film from the second nitride film 18 and the second oxide film 17 onto which the patterning has been carried out. Accordingly, a three-layered sidewall insulating film (i.e., the first nitride film 16, the second oxide film 17, and the second nitride film 18) is provided on the side surface of the upper portion of the gate electrode 20 (i.e., the upper portion of the polysilicon layer 14), and a two-layered sidewall insulating film (i.e., the second oxide film 17 and the second nitride film 18) is provided on the side surface of the lower portion of the gate electrode 20 (i.e., the lower portion of the polysilicon layer 14 and the polysilicon germanium layer 13). Further, the same processes as described in the first embodiment by referring to FIG. 6 to FIG. 8 are carried out to provide a MOSFET having a raised source/drain structure.

In the MOSFET having a raised source/drain structure in the present embodiment, the same or similar advantages obtained in the first embodiment can also be obtained.

That is, polysilicon-growth from the shoulder portion of the gate electrode 20 can be prevented at the time of forming the raised source/drain region, since the shoulder portion of the gate electrode 20a is prevented from being exposed, by the sidewall 16 formed of the first nitride film at the upper portion of the gate electrode 20a.

Since the gate electrode 20a is formed in a two-layered structure of the polysilicon layer 14 and the polysilicon germanium layer 13, which can be selectively etched, and the polysilicon germanium layer 13 is formed to be thinner by selective etching, the sidewall of the lower portion of the gate electrode 20a is retreated from the sidewall of the upper portion of the gate electrode 20a. Accordingly, the size, i.e., width, of the gate structure is reduced by at least the width of the sidewall nitride film 16. Furthermore, a gate electrode length lower than that defined by the design rule of lithography can be realized.

Since the sidewall of the lower portion of the gate electrode 20a is retreated from the sidewall of the upper portion of the gate electrode 20a, an offset is provided to the ion implantation for forming the source/drain extension region. Thus, the short channel effect can be reduced.

Third Embodiment

Figure 11:
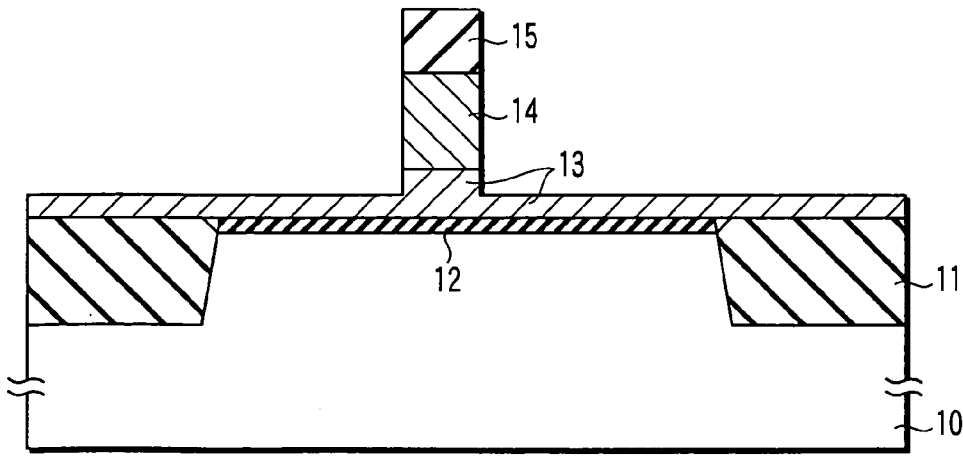
FIG. 11 is a sectional view of a semiconductor structure in a manufacturing process for explanation of a method of manufacturing a MOSFET having a raised source/drain structure according to a third embodiment of the present invention.

FIGS. 11 and 12 are sectional views of a semiconductor structure in respective manufacturing processes for explanation of a method of manufacturing a MOSFET a according to a third embodiment of the present invention.

In the same manner as in the first embodiment, an oxide film (e.g., $SiO_2$ film) is formed over the surface of the silicon substrate 10 on which the polysilicon germanium layer 13 and the polysilicon layer 14 are formed, and next, a patterning is carried out for the oxide film by using lithography technology and anisotropic etching to provide the first oxide film (e.g., $SiO_2$ film) 15, as shown in FIG. 11.

Subsequently, the polysilicon layer 14, of the superposed layer structure of the polysilicon layer 14 and the polysilicon germanium layer 13, is etched by anisotropic etching, and then, the polysilicon germanium layer 13 is etched to some depth by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewall of the first oxide film 15, the sidewall of the polysilicon layer 14 and the sidewall of the exposed portion of the polysilicon germanium layer 13 (i.e., the upper portion of the polysilicon germanium layer 13), as shown in FIG. 12. Subsequently, the other portion of the polysilicon germanium layer 13 (i.e., the lower portion of the polysilicon germanium layer 13) is selectively etched, by using the first oxide film 15 and the first gate sidewall insulating film 16 as masks, to form a gate electrode 20b formed of the polysilicon layer 14 and the polysilicon germanium layer 13, as shown in FIG. 12. This etching is carried out so that the polysilicon germanium layer 13 is etched to be smaller in width than the polysilicon layer 14. Namely, the width of the lower portion of the gate electrode 20b (i.e., the lower portion of the polysilicon germanium layer 13) is smaller than the width of the upper portion of the gate electrode 20b (i.e., the polysilicon layer 14 and the upper portion of the polysilicon germanium layer 13), and therefore, the sidewall of the lower portion of the gate electrode 20b is retreated from the sidewall of the upper portion of the gate electrode 20b.

The following processes are the same as those in the first embodiment.

That is, after that, an ion implantation is carried out to form a shallow diffusion layer (i.e., an extension region) 21a of an LDD (Lightly Doped Drain) type source/drain region in the surface layer of the silicon substrate 10.

Next, a second oxide film (for example, a TEOS oxide film) 17 and a second nitride film 18 are sequentially deposited over the surface of the semiconductor substrate 10. Thereafter, a patterning is carried out for the second nitride film 18 and the second oxide film 17, by using lithography technology and anisotropic etching, to form a second gate sidewall insulating film from the second nitride film 18 and the second oxide film 17 onto which the patterning has been carried out. Accordingly, a three-layered sidewall insulating film (i.e., the first nitride film 16, the second oxide film 17, and the second nitride film 18) is provided on the side surface of the upper portion of the gate electrode 20b (i.e., the polysilicon layer 14 and the upper portion of the polysilicon germanium layer 13), and a two-layered sidewall insulating film (i.e., the second oxide film 17 and the second nitride film 18) is provided on the side surface of the lower portion of the gate electrode 20b (i.e., the lower portion of the polysilicon germanium layer 13). Further, the same processes as described in the first embodiment by referring to FIG. 6 to FIG. 8 are carried out to provide a MOSFET having a raised source/drain structure.

Also in the MOSFET having a raised source/drain structure in the present embodiment, the same or similar advantages obtained in the first embodiment can be obtained.

That is, polysilicon-growth from the shoulder portion of the gate electrode 20b can be prevented at the time of forming the raised source/drain region, since the shoulder portion of the gate electrode 20b is prevented from being exposed, by the sidewall 16 formed of the first nitride film at the upper portion of the gate electrode 20b.

Since the gate electrode 20b is formed in a two-layered structure of the polysilicon layer 14 and the polysilicon germanium layer 13, which can be selectively etched, and the polysilicon germanium layer 13 is formed to be thinner by selective etching, the sidewall of the lower portion of the gate electrode 20b is retreated from the sidewall of the upper portion of the gate electrode 20b. Accordingly, the size, i.e., width, of the gate structure is reduced by at least the width of the sidewall nitride film 16. Furthermore, a gate electrode length lower than that defined by the design rule of lithography can be realized.

Since the sidewall of the lower portion of the gate electrode 20b is retreated from the sidewall of the upper portion of the gate electrode 20b, an offset is provided to the ion implantation for forming the source/drain extension region. Thus, the short channel effect can be reduced.

Fourth Embodiment

In the first to third embodiments, the polysilicon germanium layer 13 is etched to be smaller in width than the polysilicon layer 14. Namely, the width of the lower portion of the gate electrode 20, 20a, 20b (i.e., the polysilicon germanium layer 13 or the lower portion of the polysilicon germanium layer 13) is smaller than the width of the upper portion of the gate electrode (i.e., the polysilicon layer 14 and the polysilicon germanium layer 13, or the polysilicon layer 14 and the upper portion of the polysilicon germanium layer 13), and therefore, the sidewall of the lower portion of the gate electrode is retreated from the sidewall of the upper portion of the gate electrode. However, the present invention is not necessarily limited to the above-described embodiments. The width of the polysilicon germanium layer 13 may be made equal to the width of the polysilicon layer 14. In other words, the width of the lower portion of the gate electrode may be made equal to the width of the upper portion of the gate electrode, and accordingly, the sidewall of the lower portion of the gate electrode may be level with the sidewall of the upper portion of the gate electrode.

FIG. 13 is a sectional view of a semiconductor structure in a manufacturing process for explanation of a method of manufacturing a MOSFET having a raised source/drain structure according to a fourth embodiment of the present invention.

In the same manner as in the first embodiment, a first oxide film (e.g., SiO$_2$ film) is formed over the surface of the silicon substrate 10 on which the polysilicon germanium layer 13 and the polysilicon layer 14 are formed, and next, as shown in FIG. 13, a patterning is carried out for the oxide film by using lithography technology and anisotropic etching to provide the first oxide film (e.g., SiO$_2$ film) 15.

Subsequently, as in the first embodiment, the polysilicon layer 14, of the superposed layer structure of the polysilicon layer 14 and the polysilicon germanium layer 13, is etched by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewalls of the polysilicon layer 14 and the first oxide film 15. Subsequently, the polysilicon germanium layer 13 is selectively etched, by using the first oxide film 15 and the first gate sidewall insulating film 16 as masks. As a result, a gate electrode 20c formed of the polysilicon layer 14 and the polysilicon germanium layer 13 is formed, as shown in FIG. 13. The selective etching is carried out so that the width of the polysilicon germanium layer 13 is substantially equal to the width of the polysilicon layer 14, and accordingly, the sidewall of the polysilicon germanium layer 13 is substantially level with the sidewall of the polysilicon layer 14. Namely, the width of the lower portion of the gate electrode 20c (i.e., the polysilicon germanium layer 13) is substantially equal to the width of the upper portion of the gate electrode 20c (i.e., the polysilicon layer 14). Accordingly, the sidewall of the lower portion of the gate electrode 20c is substantially level with the sidewall of the upper portion of the gate electrode 20c.

The following processes are the same as those in the first embodiment.

That is, then, an ion implantation is carried out to form a shallow diffusion layer (i.e., an extension region) 21a of an LDD (Lightly Doped Drain) type source/drain region in the surface layer of the silicon substrate 10.

Next, a second oxide film (for example, a TEOS oxide film) 17 and a second nitride film 18 are sequentially deposited over the surface of the semiconductor substrate 10. Thereafter, a patterning is carried out for the second nitride film 18 and the second oxide film 17, by using lithography technology and anisotropic etching, to form a second gate sidewall insulating film from the second nitride film 18 and the second oxide film 17 onto which the patterning has been carried out. Accordingly, a three-layered sidewall insulating film (i.e., the first nitride film 16, the second oxide film 17, and the second nitride film 18) is provided on the side surface of the upper portion of the gate electrode 20c (i.e., the polysilicon layer 14), and a two-layered sidewall insulating film (i.e., the second oxide film 17 and the second nitride film 18) is provided on the side surface of the lower portion of the gate electrode 20 (i.e., the polysilicon germanium layer 13). Further, the same processes as described in the first embodiment by referring to FIG. 6 to FIG. 8 are carried out to provide a MOSFET having a raised source/drain structure.

Like the first to third embodiments, also in the MOSFET having a raised source/drain structure in the present embodiment, polysilicon-growth from the shoulder portion of the gate electrode 20c can be prevented at the time of forming the raised source/drain region, since the shoulder portion of the gate electrode 20c is prevented from being exposed, by the sidewall 16 formed of the first nitride film at the upper portion of the gate electrode 20c.

Fifth Embodiment

FIG. 14 is a sectional view of a semiconductor structure in a manufacturing process for explanation of a method of manufacturing a MOSFET having a raised source/drain structure according to a fifth embodiment of the present invention.

In the same manner as in the first embodiment, a first oxide film (e.g., SiO$_2$ film) is formed over the surface of the silicon substrate 10 on which the polysilicon germanium layer 13 and the polysilicon layer 14 are formed, and next, a patterning is carried out for the oxide film by using lithography technology and anisotropic etching to provide the first oxide film (e.g., SiO$_2$ film) 15.

Subsequently, as in the second embodiment, the polysilicon layer 14, of the superposed layer structure of the polysilicon layer 14 and the polysilicon germanium layer 13, is etched to some depth by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewall of the first oxide film 15 and the sidewall of the exposed portion of the polysilicon layer 14 (i.e., the upper portion of the polysilicon layer 14). Subsequently, the other portion of the polysilicon layer 14 (i.e., the lower portion of the polysilicon layer 14) and the polysilicon germanium layer 13 are selectively etched, by using the first oxide film 15 and the first gate sidewall insulating film 16 as masks, to form a gate electrode 20d formed of the polysilicon layer 14 and the polysilicon germanium layer 13, as shown in FIG. 14. The selective etching is carried out so that the width of the lower portion of the polysilicon layer 14 and the polysilicon germanium layer 13 is substantially equal to the width of the upper portion of polysilicon layer 14, and accordingly, the sidewall of the polysilicon germanium layer 13 is substantially level with the sidewall of the polysilicon layer 14. Namely, the width of the lower portion of the gate electrode 20d (i.e., the lower portion of the polysilicon layer 14 and the polysilicon germanium layer 13) is substantially equal to the width of the upper portion of the gate electrode 20d (i.e., the upper portion of the polysilicon layer 14). Accordingly, the sidewall of the lower portion of the gate electrode 20d is substantially level with the sidewall of the upper portion of the gate electrode 20d.

The following processes are the same as those in the first embodiment.

That is, after that, an ion implantation is carried out to form a shallow diffusion layer (i.e., an extension region) 21a of an LDD (Lightly Doped Drain) type source/drain region in the surface layer of the silicon substrate 10.

Next, a second oxide film (for example, a TEOS oxide film) 17 and a second nitride film 18 are sequentially deposited over the surface of the semiconductor substrate 10. Thereafter, a patterning is carried out for the second nitride film 18 and the second oxide film 17, by using lithography technology and anisotropic etching, to form a second gate sidewall insulating film from the second nitride film 18 and the second oxide film 17 onto which the patterning has been carried out. Accordingly, a three-layered sidewall insulating film (i.e., the first nitride film 16, the second oxide film 17, and the second nitride film 18) is provided on the side surface of the upper portion of the gate electrode 20 (i.e., the upper portion of the polysilicon layer 14), and a two-layered sidewall insulating film (i.e., the second oxide film 17 and the second nitride film 18) is provided on the side surface of the lower portion of the gate electrode 20 (i.e., the lower portion of the polysilicon layer 14 and the polysilicon germanium layer 13). Further, the same processes as described in the first embodiment by referring to FIG. 6 to FIG. 8 are carried out to provide a MOSFET having a raised source/drain structure.

Like the first to fourth embodiments, also in the MOSFET having a raised source/drain structure in the present embodiment, polysilicon-growth from the shoulder portion of the gate electrode 20d can be prevented at the time of forming the raised source/drain region, since the shoulder portion of the gate electrode 20d is prevented from being exposed, by the sidewall 16 formed of the first nitride film at the upper portion of the gate electrode 20d.

Sixth Embodiment

FIG. 15 is a sectional view of a semiconductor structure in a manufacturing process for explanation of a method of manufacturing a MOSFET having a raised source/drain structure according to a sixth embodiment of the present invention.

In the same manner as in the first embodiment, an oxide film (e.g., SiO$_2$ film) is formed over the surface of the silicon substrate 10 on which the polysilicon germanium layer 13 and the polysilicon layer 14 are formed, and next, a patterning is carried out for the oxide film by using lithography technology and anisotropic etching to provide the first oxide film (e.g., SiO$_2$ film) 15.

Subsequently, as in the third embodiment, the polysilicon layer 14, of the superposed layer structure of the polysilicon layer 14 and the polysilicon germanium layer 13, is etched by anisotropic etching, and then, the polysilicon germanium layer 13 is etched to some depth by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewall of the first oxide film 15, the sidewall of the polysilicon layer 14 and the sidewall of the exposed portion of the polysilicon germanium layer 13 (i.e., the upper portion of the polysilicon germanium layer 13). Subsequently, the other portion of the polysilicon germanium layer 13 (i.e., the lower portion of the polysilicon germanium layer 13) is selectively etched, by using the first oxide film 15 and the first gate sidewall insulating film 16 as masks, to form a gate electrode 20e formed of the polysilicon layer 14 and the polysilicon germanium layer 13, as shown in FIG. 15. The selective etching is carried out so that the width of the lower portion of the polysilicon germanium layer 13 is substantially equal to the width of the upper portion of the polysilicon germanium layer 13 and the polysilicon layer 14, and accordingly, the sidewall of the polysilicon germanium layer 13 is substantially level with the sidewall of the polysilicon layer 14. Namely, the width of the lower portion of the gate electrode 20e (i.e., the lower portion of the polysilicon germanium layer 13) is substantially equal to the width of the upper portion of the gate electrode 20e (i.e., the polysilicon layer 14 and the upper portion of the polysilicon germanium layer 13). Accordingly, the sidewall of the lower portion of the gate electrode 20e is substantially level with the sidewall of the upper portion of the gate electrode 20e.

The following processes are the same as those in the first embodiment.

That is, after that, an ion implantation is carried out to form a shallow diffusion layer (i.e., an extension region) 21a of an LDD (Lightly Doped Drain) type source/drain region in the surface layer of the silicon substrate 10.

Next, a second oxide film (for example, a TEOS oxide film) 17 and a second nitride film 18 are sequentially deposited over the surface of the semiconductor substrate 10. Thereafter, a patterning is carried out for the second nitride film 18 and the second oxide film 17, by using lithography technology and anisotropic etching, to form a second gate sidewall insulating film from the second nitride film 18 and the second oxide film 17 onto which the patterning has been carried out. Accordingly, a three-layered sidewall insulating film (i.e., the first nitride film 16, the second oxide film 17, and the second nitride film 18) is provided on the side surface of the upper portion of the gate electrode 20e (i.e., the polysilicon layer 14 and the upper portion of the polysilicon germanium layer 13), and a two-layered sidewall insulating film (i.e., the second oxide film 17 and the second nitride film 18) is provided on the side surface of the lower portion of the gate electrode 20e (i.e., the lower portion of the polysilicon germanium layer 13). Further, the same processes as described in the first embodiment by referring to FIG. 6 to FIG. 8 are carried out to provide a MOSFET having a raised source/drain structure.

Like the first to fifth embodiments, also in the MOSFET having a raised source/drain structure in the present embodiment, polysilicon-growth from the shoulder portion of the gate electrode 20e can be prevented at the time of forming the raised source/drain region, since the shoulder portion of the gate electrode 20e is prevented from being exposed, by the sidewall 16 formed of the first nitride film at the upper portion of the gate electrode 20e.

The present invention is not necessarily limited to the above-descried embodiment. The width of the polysilicon germanium layer 13 may be made larger than that of the polysilicon layer 14. In other words, the width of the lower portion of the gate electrode (i.e., the polysilicon germanium layer 13) may be larger than that of the upper portion of the gate electrode (i.e., the polysilicon layer 14), and thus, the sidewall of the lower portion of the gate electrode may be extended beyond the sidewall of the upper portion of the gate electrode.

Seventh Embodiment

FIG. 16 is a sectional view of a semiconductor structure in a manufacturing process for explanation of a method of manufacturing a MOSFET having a raised source/drain structure according to a seventh embodiment of the present invention.

In the same manner as in the first embodiment, a first oxide film (e.g., SiO$_2$ film) is formed over the surface of the silicon substrate 10 on which the polysilicon germanium layer 13 and the polysilicon layer 14 are formed, and next, as shown in FIG. 13, a patterning is carried out for the oxide film by using lithography technology and anisotropic etching to provide the first oxide film (e.g., SiO$_2$ film) 15.

Subsequently, as in the first and fourth embodiments, the polysilicon layer 14, of the superposed layer structure of the polysilicon layer 14 and the polysilicon germanium layer 13, is etched by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewalls of the polysilicon layer 14 and the first oxide film 15. Subsequently, the polysilicon germanium layer 13 is selectively etched, by using the first oxide film 15 and the first gate sidewall insulating film 16 as masks. As a result, a gate electrode 20f formed of the polysilicon layer 14 and the polysilicon germanium layer 13 is formed, as shown in FIG. 16. The selective etching is carried out so that the width of the polysilicon germanium layer 13 is larger than the width of the polysilicon layer 14 by an amount corresponding to the film thickness of the first gate sidewall insulating film 16. Namely, the width of the lower portion of the gate electrode 20f (i.e., the polysilicon germanium layer 13) is larger than the width of the upper portion of the electrode 20f (i.e., the polysilicon layer 14) by the amount corresponding to the film thickness of the first gate sidewall insulating film 16. Therefore, the sidewall of the lower portion of the gate electrode 20f is extended beyond the sidewall of the upper portion of the gate electrode 20f by the amount corresponding to the film thickness of the first gate sidewall insulating film 16. The following processes are the same as those in the first embodiment, and the description is omitted.

Like the first to sixth embodiments, also in the MOSFET having a raised source/drain structure in the present embodiment, polysilicon-growth from the shoulder portion of the gate electrode 20f can be prevented at the time of forming the raised source/drain region, since the shoulder portion of the gate electrode 20f is prevented from being exposed, by the sidewall 16 formed of the first nitride film at the upper portion of the gate electrode 20f.

Eighth Embodiment

FIG. 17 is a sectional view of a semiconductor structure in a manufacturing process for explanation of a method of manufacturing a MOSFET having a raised source/drain structure according to an eighth embodiment of the present invention.

In the same manner as in the first embodiment, a first oxide film (e.g., SiO$_2$ film) is formed over the surface of the silicon substrate 10 on which the polysilicon germanium layer 13 and the polysilicon layer 14 are formed, and next, a patterning is carried out for the oxide film by using lithography technology and anisotropic etching to provide the first oxide film (e.g., SiO$_2$ film) 15.

Subsequently, as in the second and fifth embodiments, the polysilicon layer 14, of the superposed layer structure of the polysilicon layer 14 and the polysilicon germanium layer 13, is etched to some depth by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewall of the first oxide film 15 and the sidewall of the exposed portion of the polysilicon layer 14 (i.e., the upper portion of the polysilicon layer 14). Subsequently, the other portion of the polysilicon layer 14 (i.e., the lower portion of the polysilicon layer 14) and the polysilicon germanium layer 13 are selectively etched, by using the first oxide film 15 and the first gate sidewall insulating film 16 as masks, to form a gate electrode 20g formed of the polysilicon layer 14 and the polysilicon germanium layer 13, as shown in FIG. 17. The selective etching is carried out so that the width of the polysilicon germanium layer 13 is larger than the width of the polysilicon layer 14 by an amount corresponding to the film thickness of the first gate sidewall insulating film 16. Namely, the width of the lower portion of the gate electrode 20f (i.e., the polysilicon germanium layer 13) is larger than the width of the upper portion of the electrode 20f (i.e., the polysilicon layer 14) by the amount corresponding to the film thickness of the first gate sidewall insulating film 16. Therefore, the sidewall of the lower portion of the gate electrode 20*g* is extended beyond the sidewall of the upper portion of the gate electrode 20*g* by the amount corresponding to the film thickness of the first gate sidewall insulating film 16. The following processes are the same as those in the first embodiment, and the description is omitted.

Like the first to sixth embodiments, also in the MOSFET having a raised source/drain structure in the present embodiment, polysilicon-growth from the shoulder portion of the gate electrode 20*g* can be prevented at the time of forming the raised source/drain region, since the shoulder portion of the gate electrode 20*g* is prevented from being exposed, by the sidewall 16 formed of the first nitride film at the upper portion of the gate electrode 20*g*.

Ninth Embodiment

Figure 18:
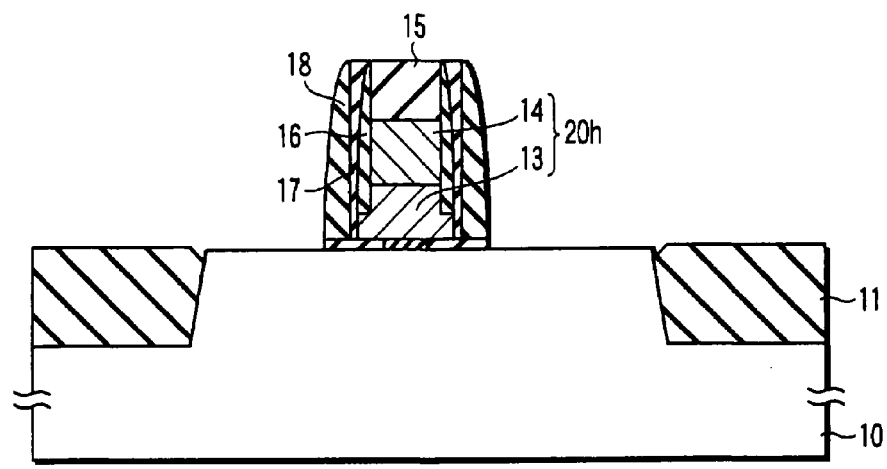
FIG. 18 is a sectional view of a semiconductor structure in a manufacturing process for explanation of a method of manufacturing a MOSFET having a raised source/drain structure according to a ninth embodiment of the present invention.
Figure 19:
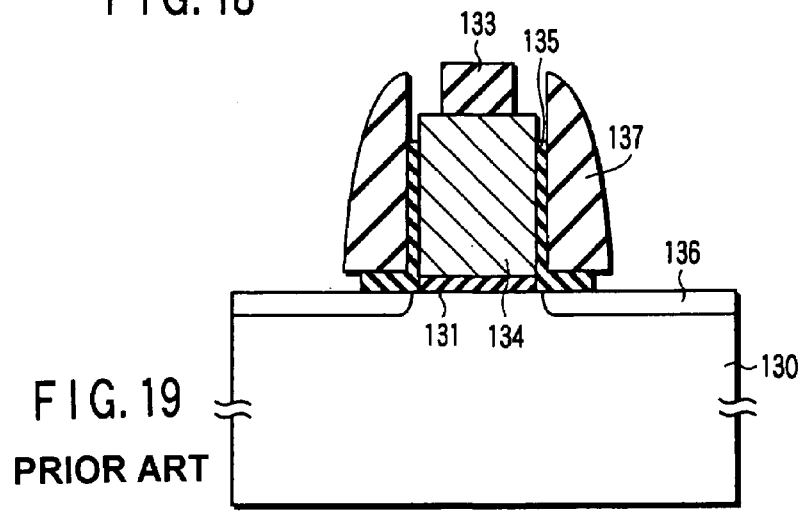
FIG. 19 is a sectional view of a semiconductor structure in a manufacturing process of a conventional MOSFET having a raised source/drain structure, for explanation of a state at the time of processing a fine polysilicon gate electrode.
Figure 20:
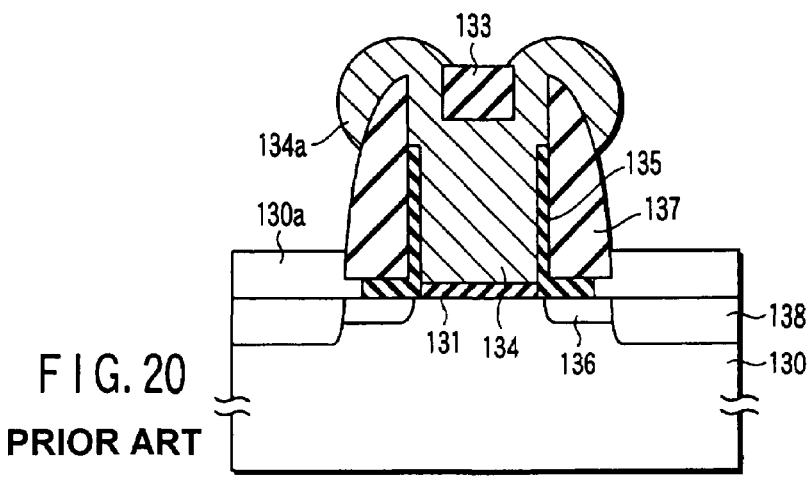
FIG. 20 is a sectional view of the semiconductor structure in a manufacturing process of the conventional MOSFET having a raised source/drain structure, for explanation of a problem brought about at the time of processing a fine polysilicon gate electrode.

FIG. 18 is a sectional view of a semiconductor structure in a manufacturing process for explanation of a method of manufacturing a MOSFET having a raised source/drain structure according to a ninth embodiment of the present invention.

In the same manner as in the first embodiment, an oxide film (e.g., $SiO_2$ film) is formed over the surface of the silicon substrate 10 on which the polysilicon germanium layer 13 and the polysilicon layer 14 are formed, and next, a patterning is carried out for the oxide film by using lithography technology and anisotropic etching to provide the first oxide film (e.g., $SiO_2$ film) 15.

Subsequently, as in the third and sixth embodiments, the polysilicon layer 14, of the superposed layer structure of the polysilicon layer 14 and the polysilicon germanium layer 13, is etched by anisotropic etching, and then, the polysilicon germanium layer 13 is etched to some depth by anisotropic etching, by using the first oxide film 15 onto which the patterning has been carried out as a mask.

Next, a first nitride film (SiN film) is formed to be about 10 nm over the surface of the silicon substrate 10, and then an anisotropic etching is carried out for the first nitride to form the first gate sidewall insulating film 16 of the nitride film on the sidewall of the first oxide film 15, the sidewall of the polysilicon layer 14 and the sidewall of the exposed portion of the polysilicon germanium layer 13 (i.e., the upper portion of the polysilicon germanium layer 13). Subsequently, the other portion of the polysilicon germanium layer 13 (i.e., the lower portion of the polysilicon germanium layer 13) is selectively etched, by using the first oxide film 15 and the first gate sidewall insulating film 16 as masks, to form a gate electrode 20*h* formed of the polysilicon layer 14 and the polysilicon germanium layer 13, as shown in FIG. 18. The selective etching is carried out so that the width of the lower portion of the polysilicon germanium layer 13 is larger than the width of the polysilicon layer 14 by an amount corresponding to the film thickness of the first gate sidewall insulating film 16. Namely, the width of the lower portion of the gate electrode 20*f* (i.e., the lower portion of the polysilicon germanium layer 13) is larger than the width of the upper portion of the electrode 20*f* (i.e., the upper portion of the polysilicon germanium layer 13 and the polysilicon layer 14) by the amount corresponding to the film thickness of the first gate sidewall insulating film 16. Therefore, the sidewall of the lower portion of the gate electrode 20*h* is extended beyond the sidewall of the upper portion of the gate electrode 20*h* by the amount corresponding to the film thickness of the first gate sidewall insulating film 16. The following processes are the same as those in the first embodiment, and the description is omitted.

Like the first to eighth embodiments, also in the MOSFET having a raised source/drain structure in the present embodiment, polysilicon-growth from the shoulder portion of the gate electrode 20*g* can be prevented at the time of forming the raised source/drain region, since the shoulder portion of the gate electrode 20*g* is prevented from being exposed, by the sidewall 16 formed of the first nitride film at the upper portion of the gate electrode 20*h*.

In accordance with the semiconductor apparatus and the methods of manufacturing the same in the above-described embodiments of the present invention, short-circuiting between the gate electrode and the source/drain region that will occur as the gate electrode of a MOSFET having a raised source/drain structure is made finer can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
  a gate electrode formed on a surface of a semiconductor substrate with a gate insulating film provided therebetween;
  a gate sidewall insulating film having a three-layered structure formed of a first nitride film, an oxide film, and a second nitride film, which are formed on a sidewall of an upper portion of the gate electrode, and a gate sidewall insulating film having a two-layered structure formed of the oxide film and the second nitride film, which are formed on a sidewall of a lower portion of the gate electrode; and
  a raised source/drain region formed of an impurity region formed in a surface layer of the semiconductor substrate and an impurity region grown on the impurity region,
  wherein the gate electrode comprises a polysilicon germanium layer, a polysilicon layer and a silicide layer are sequentially formed on the semiconductor substrate in order, and
  wherein the gate sidewall insulating film having a three-layered structure is formed on a sidewall of the silicide layer and a sidewall of the polysilicon layer, and the gate sidewall insulating film having a two-layered structure is formed on a sidewall of the polysilicon germanium layer.

2. The semiconductor apparatus according to claim 1, wherein the raised source/drain region comprises a silicide layer formed thereon.

3. The semiconductor apparatus according to claim 1, wherein a width of the lower portion of the gate electrode is smaller than that of the upper portion of the gate electrode.

4. The semiconductor apparatus according to claim 3, wherein the lower portion of the gate electrode comprises the polysilicon germanium layer.

5. The semiconductor apparatus according to claim 1, wherein the source/drain region has an LDD structure including a low impurity concentration region and a high impurity concentration region.

6. A semiconductor apparatus comprising:
- a gate electrode formed on a surface of a semiconductor substrate with a gate insulating film provided therebetween;
- a gate sidewall insulating film having a three-layered structure formed of a first nitride film, an oxide film, and a second nitride film, which are formed on a sidewall of an upper portion of the gate electrode, and a gate sidewall insulating film having a two-layered structure formed of the oxide film and the second nitride film, which are formed on a sidewall of a lower portion of the gate electrode; and
- a raised source/drain region formed of an impurity region formed in a surface layer of the semiconductor substrate and an impurity region grown on the impurity region,
- wherein the gate electrode comprises a polysilicon germanium layer, a polysilicon layer and a silicide layer are sequentially formed on the semiconductor substrate in order, and
- wherein the gate sidewall insulating film having a three-layered structure is formed on a sidewall of the silicide layer and a sidewall of an upper portion of the polysilicon layer, and the gate sidewall insulating film having a two-layered structure is formed on a sidewall of a lower portion of the polysilicon layer and a sidewall of the polysilicon germanium layer.

7. The semiconductor apparatus according to claim 6, wherein the raised source/drain region comprises a silicide layer formed thereon.

8. The semiconductor apparatus according to claim 6, wherein a width of the polysilicon germanium layer at the lower portion of the gate electrode is smaller than the width of the upper portion of the gate electrode.

9. The semiconductor apparatus according to claim 8, wherein the lower portion of the gate electrode comprises the lower portion of the polysilicon layer and the polysilicon germanium layer.

10. The semiconductor apparatus according to claim 6, wherein the source/drain region has an LDD structure including a low impurity concentration region and a high impurity concentration region.

11. A semiconductor apparatus comprising:
- a gate electrode formed on a surface of a semiconductor substrate with a gate insulating film provided therebetween:
- a gate sidewall insulating film having a three-layered structure formed of a first nitride film, an oxide film, and a second nitride film, which are formed on a sidewall of an upper portion of the gate electrode, and a gate sidewall insulating film having a two-layered structure formed of the oxide film and the second nitride film, which are formed on a sidewall of a lower portion of the gate electrode; and
- a raised source/drain region formed of an impurity region formed in a surface layer of the semiconductor substrate and an impurity region grown on the impurity region,
- wherein the gate electrode comprises a polysilicon germanium layer, a polysilicon layer and a silicide layer are sequentially formed on the semiconductor substrate in order, and
- wherein the gate sidewall insulating film having a three-layered structure is formed on a sidewall of the silicide layer, a sidewall of the polysilicon layer and a sidewall of an upper portion of the polysilicon germanium layer, and the gate sidewall insulating film having a two-layered structure is formed on a sidewall of a lower portion of the polysilicon germanium layer.

12. The semiconductor apparatus according to claim 11, wherein the raised source/drain region comprises a silicide layer formed thereon.

13. The semiconductor apparatus according to claim 11, wherein a width of the lower portion of the gate electrode is smaller than that of the upper portion of the gate electrode.

14. The semiconductor apparatus according to claim 13, wherein the lower portion of the gate electrode comprises the lower portion of the polysilicon germanium layer.

15. The semiconductor apparatus according to claim 11, wherein the source/drain region has an LDD structure including a low impurity concentration region and a high impurity concentration region.

* * * * *